(12) United States Patent
Hong et al.

(10) Patent No.: US 6,288,946 B1
(45) Date of Patent: Sep. 11, 2001

(54) METHOD OF ERASING A FLASH MEMORY DEVICE

(75) Inventors: Sung Hoon Hong; Jae Chun An, both of Seoul; Mun Hwa Lee; Soo Min Cho, both of Sungnam-shi, all of (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/722,313

(22) Filed: Nov. 28, 2000

(30) Foreign Application Priority Data

Dec. 29, 1999 (KR) .................................................. 99-65010

(51) Int. Cl.[7] .................................................. G11C 13/00
(52) U.S. Cl. .................. 365/185.29; 365/185.33; 365/218

(58) Field of Search ............................... 365/185.33, 218, 365/210, 185.29, 230.03

(56) References Cited

U.S. PATENT DOCUMENTS 6,016,561 * 1/2000 Roohparvar et al. ........... 365/230.03

* cited by examiner

*Primary Examiner*—Terrell W. Fears
(74) *Attorney, Agent, or Firm*—Finnegan, Henderson, Farabow, Garrett & Dunner, L.L.P.

(57) ABSTRACT

There is disclosed a method of erasing a flash memory device. The present invention implements a dummy recovery operation after a recovery operation for recovering the threshold voltage of an over-erased memory cell is implemented. Therefore, it can reduce the flow of the leakage current through bit lines to thus improve the program characteristic of the device.

4 Claims, 2 Drawing Sheets

METHOD OF ERASING A FLASH MEMORY DEVICE

CROSS-REFERENCE TO RELATED APPLICATION

Priority is claimed from Republic of Korean Patent Application No. 99-65010 filed Dec. 29, 1999, which is incorporated in its entirety by reference.

BACKGROUND OF THE INVENTION

1. Field of the Invention

The invention relates generally to a method of erasing a flash memory device, and more particularly to, a method of erasing a flash memory device by which a flow of leakage current can be reduce through bit lines.

2. Description of the Prior Art

In general, a flash memory device having an electrical program and erasure function is consisted of a memory cell array and peripheral circuits. The memory cell array is consisted in such a manner that a plurality of memory cells for storing information are connected between word lines and bit lines, for example, in a matrix manner. The peripheral circuits are consisted of a circuit that outputs the information stored at the memory cell to the outside or stores information inputted from the outside at the memory cell.

As mentioned above, the memory cell at which information is stored is consisted of a gate electrode formed on a semiconductor substrate, and a source and a drain both formed in the semiconductor substrate on both sides of the gate electrode. The gate electrode is consisted of a structure in which a tunnel oxide film, a floating gate, a dielectric film and a control gate ate stacked.

Then, the principle of the program operation for storing information at the memory cell and the erasure operation for erasing the stored information will be explained shortly as follows.

First, if a program bias voltage is applied the control gate, the source and the drain in a selected memory cell, respectively, hot carriers generated at the semiconductor substrate are injected into the floating gate through the tunnel oxide film. Thus, as the threshold voltage of the memory cell is increased over a certain level, the memory cell is kept at a program state.

On the other hand, if an erasure bias voltage is applied to the control gate, the source and the drain, respectively, hot carriers injected into the floating gate are discharged to the semiconductor substrate. Thus, as the threshold voltage of the memory cell is reduced below a certain level, the memory cell is kept at an erasure state.

Then, the erasure procedure of the flash memory device driven by this principle will be below explained by reference to FIGS. 1 and 2.

The conventional flash memory device has a chip erasure function. The chip erasure function is one to erase memory cells in a memory cell array consisted of a plurality of sectors, which applies an erasure bias voltage all the memory cells in the first sector selected and then applies an erasure verification bias voltage to the memory cells in the sector to very whether respective memory cells have been erased or not. If all the memory cells in the selected sector is erased by this erasure operation, a recovery verification operation for discriminating over-erased memory cells and a recovery operation for recovering the threshold voltages of the over-erased memory cells to a certain level are sequentially implemented.

At this time, the recovery verification operation is a procedure of checking whether or not any leakage current flows through a drain of the memory cell, that is, bit lines, by applying, for example, 0V, 1V and 0V, to a control gate, a drain and a source in the selected memory cell, respectively. In case of the over-erased memory cell, the leakage current flowed through the bit line is generated. Therefore, the recovery operation must be implemented in order to recover the threshold voltage of the over-erased memory cell. Thus, in the recovery operation, voltages of 0V, 5.5V and 0V are applied to the control gate, the drain and the source in the memory cell, respectively.

However, when the memory cell is erased using the conventional erasure method mentioned above, the leakage currents flowed through the erased memory cells are different depending on the temperature of the device. Particularly, when the leakage current is measured after the erasure operation is implemented at low temperature, the flow of the leakage current is very great.

FIG. 1 is a graph showing a flow of a leakage current through bit lines, measured after erasure operation is implemented at room temperature;

FIG. 2 is a graph showing a flow of a leakage current through bit lines, measured after erasure operation is implemented at high temperature (for example, 90° C.). As can be seen from the graphs, when the leakage current is measured at room temperature after the erasure operation is implemented at room temperature, the greatest leakage current is less than 7 $\mu$m. However, when the leakage current is measured at high temperature after the erasure operation is implemented at room temperature, the greatest leakage current is about 14 $\mu$m. Thus, it can be seen that the amount of the leakage current measured at high temperature is twice that measured at room temperature. Therefore, the program characteristic of the device is degraded since the leakage current exceeding the program verification current (about 10~27 $\mu$m depending on the device) is generated.

SUMMARY OF THE INVENTION

It is therefore an object of the present invention to provide a method of erasing a flash memory device capable of solving the above problem by implementing a dummy recovery operation after a recovery operation is implemented.

In order to accomplish the above object, a method of erasing a flash memory device according to the present invention is characterized in that it comprises a first step of applying an erasure bias voltage to memory cells in a selected sector and then implementing an erasure verification operation for respective said memory cells; a second step of implementing a recovery verification operation for discriminating any over-erased memory cell; a third step of implementing a recovery operation for recovering the threshold voltage of the erased memory cell; and a fourth step of implementing a dummy recovery operation for stably maintaining the threshold voltage of the erased memory cell.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings.

A method of erasing a flash memory device according to the present invention will be below explained.

A first step: after an erasure bias voltage is applied to all the memory cells in a selected sector, an erasure verification operation for verifying whether the memory cells are erased or not is implemented.

A second step: if all the memory cells in the selected sector are erased by the erasure operated, a recovery verification operation is implemented in order to discriminate any over-erased memory cells. Then, a recovery operation for recovering the threshold voltage of the erased memory cell to a certain level is implemented. At this time, the recovery verification operation applies for example, 0V, 1V and 0V, to a control gate, a drain and a source of the selected memory cell, respectively in order to check whether or not any leakage current flows through the drain of the memory cell, that is, a bit line. In case of the over-erased memory cell, the leakage current flowed through the bit line is generated. Therefore, the recovery operation must be implemented in order to recover the threshold voltage of the over-erased memory cell. Thus, in the recovery operation, voltages of 0V, 5.5V and 0V are applied to the control gate, the drain and the source in the memory cell, respectively.

A third step: a dummy recovery operation is implemented in order to stably maintain the threshold voltage of the memory cell existing at the sector. During the dummy recovery operation, the condition on the bias voltage applied to respective memory cells is same to that during the recovery operation. At this time, a dummy recovery bias voltage is applied in single bit unit or plural bit units, that is, one or more bit lines or a dummy recovery bias voltage is applied to bit lines in all the sectors.

Figure 1:
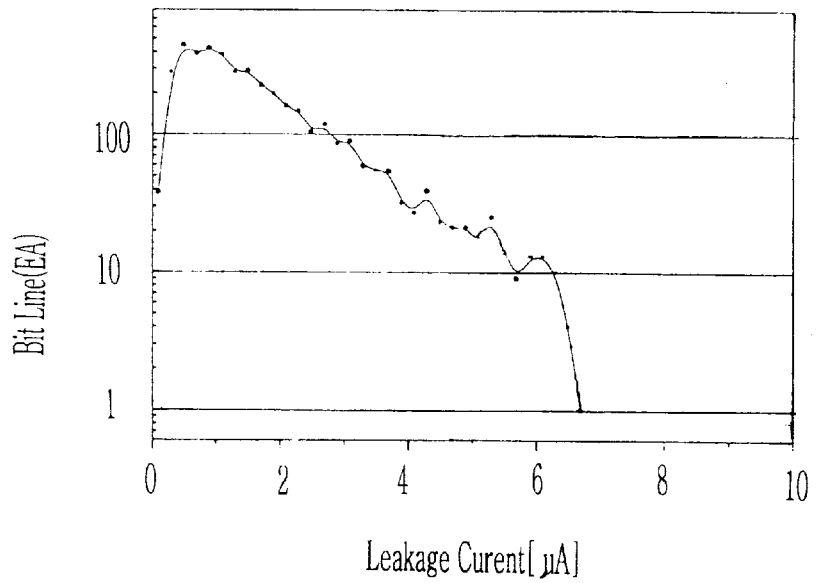
FIG. 1 is a graph showing a flow of a leakage current through bit lines, measured after erasure operation is implemented at room temperature.
Figure 2:
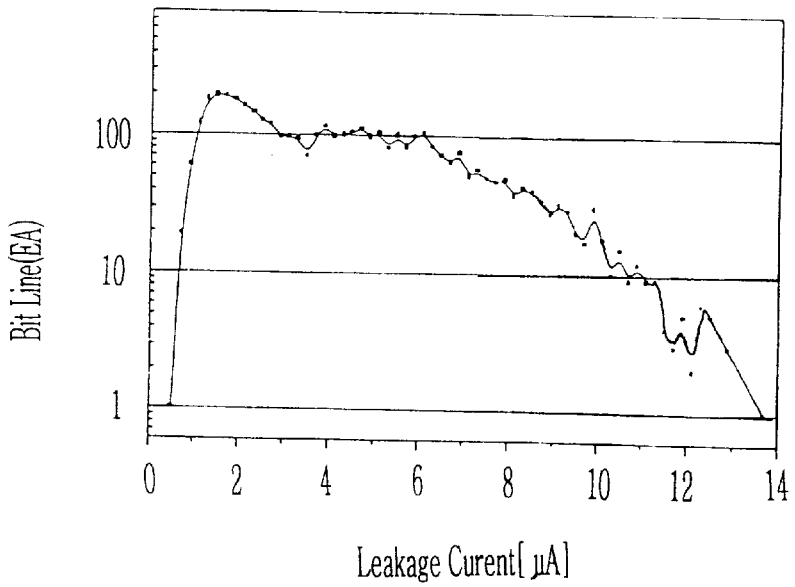
FIG. 2 is a graph showing a flow of a leakage current through bit lines, measured after erasure operation is implemented at high temperature.
Figure 3:
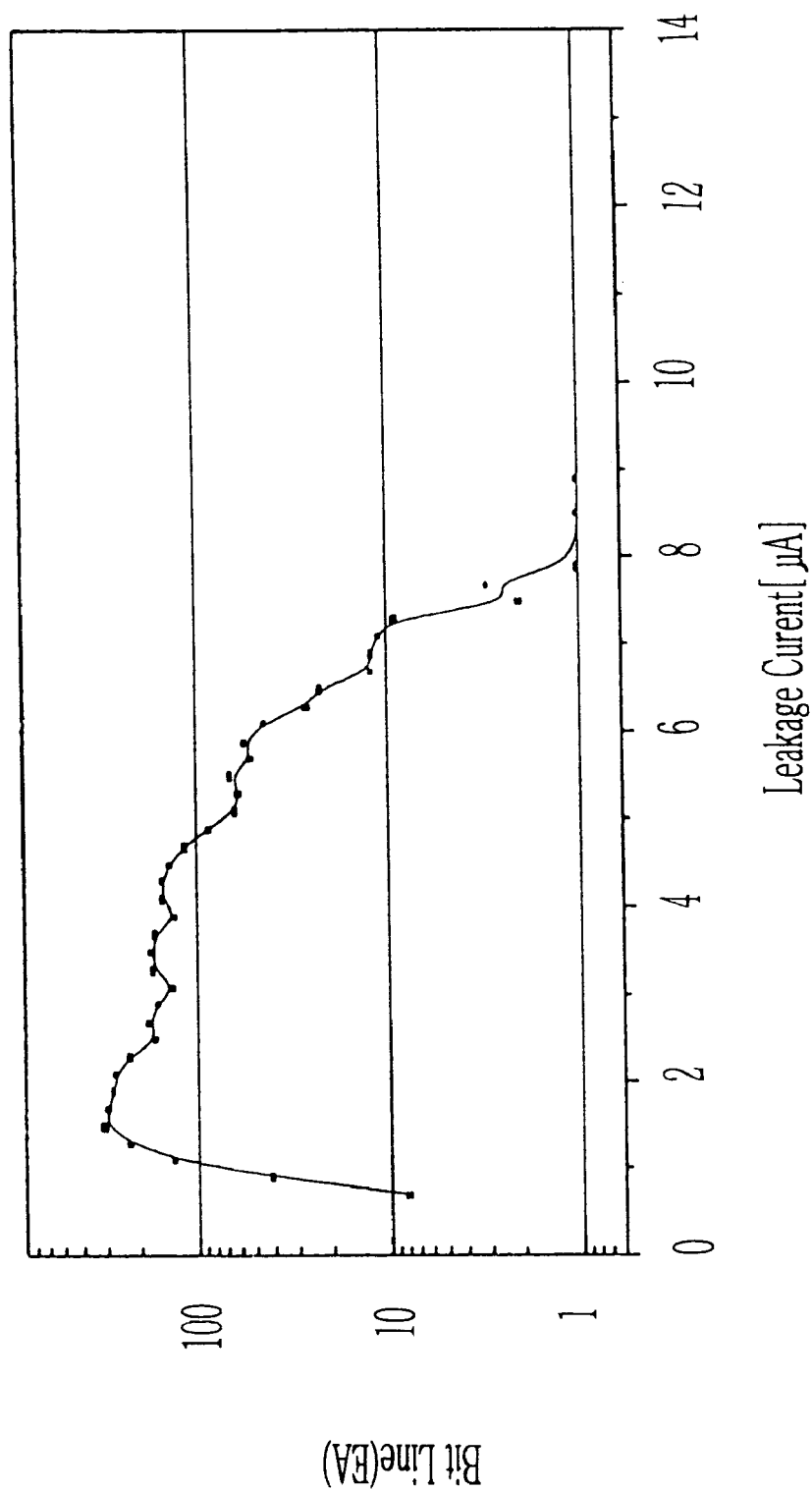
FIG. 3 is a graph showing a flow of a leakage current through bit lines, measured after erasure operation is implemented at room temperature according to the present invention.

FIG. 3 is a graph showing a flow of a leakage current through bit lines, measured after the erasure operation is implemented at room temperature according to the present invention. From the drawing, it can be seen that the flow of the leakage current is reduced by about 5 $\mu$m compared to that in FIG. 2. This is sufficient to improve the program characteristic of the device, considering that the program verification current of the flash memory device that has been presently manufactured by the applicant is at least 10 $\mu$m.

Also, in case that the erasure method according to the present invention is employed, the dummy recovery operation could be implemented before the recovery verification operation is implemented. In this case, the effect of reducing the leakage current could be obtained but the recovery bias voltage may be not applied to various bit lines due to surplus leakage current when the recovery operation is implemented.

As mentioned above, the present invention implements a dummy recovery operation after a recovery operation is implemented in order to stably maintain the threshold voltage of an erased memory cell, thus effectively reducing the flow of the leakage current through bit lines. Therefore, the present invention has the following advantages: (1) it can improve the program characteristic at high temperature, (2) it can increase the operational margin of the device, and (3) it can reduce the time to test a wafer level and a package level which are performed in the manufacture process of a device.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of erasing a flash memory device, comprising:

applying an erasure bias voltage to memory cells in a selected sector of said device and subsequently implementing an erasure verification operation for respective erased memory cells;

implementing a recovery verification operation for discriminating any over-erased memory cell;

implementing a recovery operation for recovering a threshold voltage associated with the erased memory cell; and implementing a dummy recovery operation for stably maintaining the threshold voltage of the erased memory cell.

2. The method according to claim 1, wherein after implementing said recovery verification operation, said dummy recovery operation is implemented.

3. The method according to claim 1, wherein said dummy recovery operation comprises plural bit line unit implementation.

4. The method according to claim 1, wherein said dummy recovery operation comprises a sector unit implementation.

* * * * *